US006737700B1

United States Patent
Chang et al.

(10) Patent No.: US 6,737,700 B1
(45) Date of Patent: May 18, 2004

(54) NON-VOLATILE MEMORY CELL STRUCTURE AND METHOD FOR MANUFACTURING THEREOF

(75) Inventors: Ko-Hsing Chang, Hsin-Chu (TW); Cheng-Yuan Hsu, Hsin-Chu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/249,864

(22) Filed: May 13, 2003

(51) Int. Cl.[7] ............................................. H01L 29/788
(52) U.S. Cl. ..................... 257/315; 257/315; 257/316
(58) Field of Search ................................. 257/315, 301, 257/296, 291, 309, 311; 365/185.05; 438/257

(56) References Cited

U.S. PATENT DOCUMENTS 5,910,912 A * 6/1999 Hsu et al. ............... 365/185.01
6,620,683 B1 * 9/2003 Lin et al. .................... 438/257
2003/0155599 A1 * 8/2003 Hsu et al. .................... 257/296

* cited by examiner

Primary Examiner—David Nelms
Assistant Examiner—Thinh T Nguyen
(74) Attorney, Agent, or Firm—Winston Hsu

(57) ABSTRACT

A non-volatile memory cell having a symmetric cell structure is disclosed. The non-volatile memory cell includes a substrate, a tunnel oxide layer, two floating gates, a dielectric layer, a plurality of spacers, a control gate, and two split gates. The substrate has at least two sources and a drain that is located between the sources. The floating gates are formed on the tunneling oxide layer, and each of floating gates is located between each source and the drain. The dielectric layer is formed on the floating gates. The control gate is formed over the drain and is between the floating gates. The split gates are located adjacent to outward sidewalls of the floating gates, respectively. Therefore, each of the split gates is opposite to the control gate through each of the floating gates.

5 Claims, 9 Drawing Sheets

NON-VOLATILE MEMORY CELL STRUCTURE AND METHOD FOR MANUFACTURING THEREOF

BACKGROUND OF INVENTION

1. Field of the Invention

The present invention relates to a memory cell structure. More specifically, the present invention relates to a non-volatile memory cell structure and a manufacturing method thereof.

2. Description of the Prior Art

Computer storage media technology is evolving rapidly. While hard drives and CD-ROMs will still be around for years to come because of their high capacity and low cost, new forms of storage are constantly being developed. One technology that appears to have distinct advantages over conventional forms of storage is flash memory. Like conventional storage systems, flash memory is nonvolatile, requiring no power to maintain the stored information, and rewriteable.

FIG. 1 is a sectional schematic diagram illustrating a prior art non-volatile memory cell structure 1. As shown in FIG. 1, prior art non-volatile memory cell structures 1 includes a substrate 10, a tunneling oxide layer 11 formed on the substrate 10, a floating gate formed on the tunneling oxide layer 11, a dielectric layer 13, and a control gate 14. A drain region 15 and a source region 16 are provided in the substrate 10.

FIG. 2 illustrates another prior art non-volatile memory cell structure 2 having a split gate for improving work performance and reliability of the non-volatile memory cell structure 2. As shown in FIG. 2, the prior art non-volatile memory cell structure 2 includes a substrate 20, a tunneling oxide layer 21, a floating gate 22, a dielectric layer 23, a control gate 24, a polysilicon spacer 25, and an erase oxide layer 26. A drain region 27 and a source region 28 are provided in the substrate 20. The polysilicon spacer 25 functions as a split gate which is isolated from the substrate 20 and the stacked gate structure consisting of the floating gate 22 and the control gate 24 by the erase oxide layer 26.

The manufacturing process for the above-mentioned prior art non-volatile memory cell structure 2 is complex. To manufacture the prior art non-volatile memory cell structure 2 as set forth in FIG. 2, a first polysilicon layer is deposited over the substrate 10, which is thereafter patterned and etched to form the floating gate 22. After this, a second polysilicon layer is deposited and is then patterned and etched to form the control gate 24. After the formation of the control gate 24, a third polysilicon layer is deposited thereon. The third polysilicon layer is subjected to an etching back process to form the split gate structure 25. Therefore, it needs three polysilicon layers to complete the prior art non-volatile memory cell structure 2.

However, the above-mentioned prior art non-volatile memory cell structure is quite not compatible with the manufacturing process for the peripheral logic circuit. It is well known that, in most cases, the peripheral logic circuit includes CMOS single-poly transistors. The memory cell structure determines the degree of integration between the manufacturing process for the non-volatile memory cells and the manufacturing process for the peripheral logic circuit thereof. Moreover, the coupling ratio of the above-mentioned prior art non-volatile memory cell structure is still low. It is known that the coupling ratio is basically proportional to the overlapping area between the floating gate and the control gate and is an important factor related to the operation of the non-volatile memory. Therefore, to maintain sufficient overlapping area between the floating gate and the control gate, namely, coupling ratio, the possibility of further miniaturizing the memory cell size is hindered.

In light of the foregoing, there is a need to provide an improved non-volatile memory cell structure that is capable of eliminating the aforementioned problems.

SUMMARY OF INVENTION

Accordingly, one object of the present invention is to provide an improved non-volatile memory cell structure having reduced numbers of polysilicon layer and increased overlapping area between control gate and floating gates.

Another object of the present invention is to provide a non-volatile memory cell structure having the control gate disposed between two floating gates, and the control gate and split gates are formed in the same etching step.

To achieve these and other advantages and in accordance with the purposes of the invention, as embodied and broadly described herein, the present invention provides a non-volatile memory cell structure including a substrate having thereon at least a drain and two sources. The drain is disposed between the two sources. A tunneling oxide layer is formed on the substrate. Two floating gates are disposed on the tunneling oxide layer, and each of the two floating gates is disposed between the drain and one of the two sources. A dielectric layer is disposed on the floating gates. A plurality of spacers are formed on sidewalls of the floating gates. A control gate is formed over the drain and is disposed between the two floating gates. Two split gates are symmetrically formed on an outer side of the floating gates opposite to the control gate.

According to one aspect of the present invention, the present invention also pertains to a manufacturing method for making the non-volatile memory cell structure. The manufacturing method includes the steps of providing a substrate having thereon a tunneling oxide layer, a floating gate layer and a dielectric layer;etching the floating gate layer and the dielectric layer in order to define two floating gates;forming a plurality of spacers on sidewalls of the floating gates;oxidizing the substrate to grow a control gate oxide layer between the two floating gates and split gate oxide layer on an outer side of each of the two floating gates; implanting ions into the substrate to form a drain between the two floating gates; depositing a gate layer over the substrate, the gate layer covering the dielectric layer and the spacers:forming a photo mask on the gate layer, the photo mask being disposed over the drain; and etching the gate layer to form a control gate over the drain and simultaneously form a split gate at the outer side of each of the two floating gate in a self-aligned manner, the split gate being opposite to the control gate.

It is advantageous to use the present invention because the control gate of the non-volatile memory cell is located between two floating gates, thereby increasing the overlapping area between the control gate and the floating gates. The overlapping area includes the sidewalls of the floating gates and a portion of the top surface of the floating gates. This results in an increased coupling ratio. Furthermore, the split gates and the control gate are formed by etching the same polysilicon layer (second polysilicon layer). Only two layers of polysilicon are needed to complete the non-volatile memory cell of this invention. By doing this, the manufacturing process for the novel non-volatile memory cell structure of this invention can be well compatible with the manufacturing process for the peripheral circuit.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
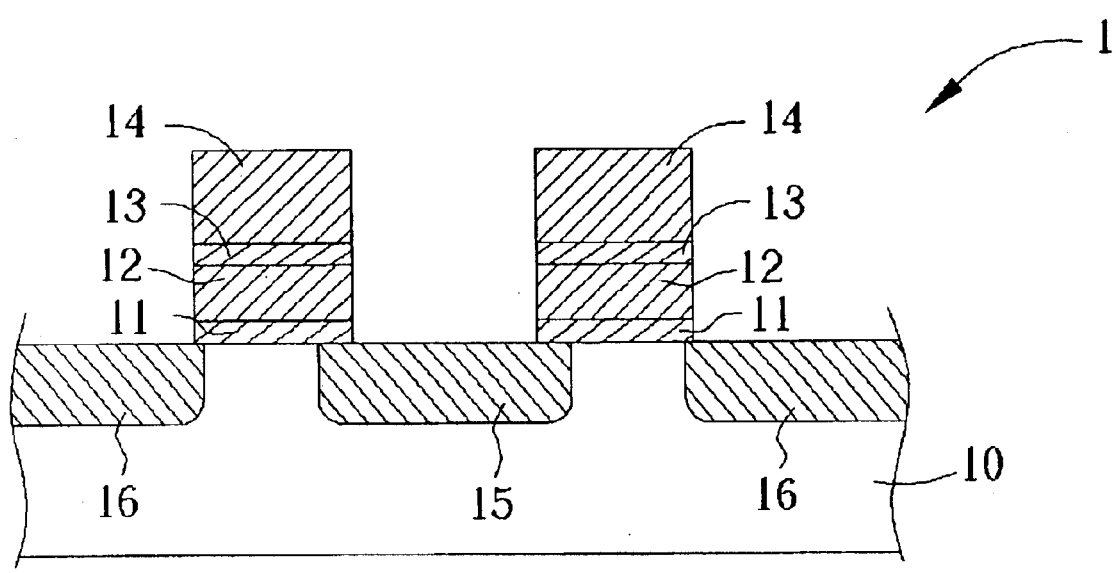
FIG. 1 is a sectional schematic diagram Illustrating a prior art non-volatile memory cell structure 1.
Figure 2:
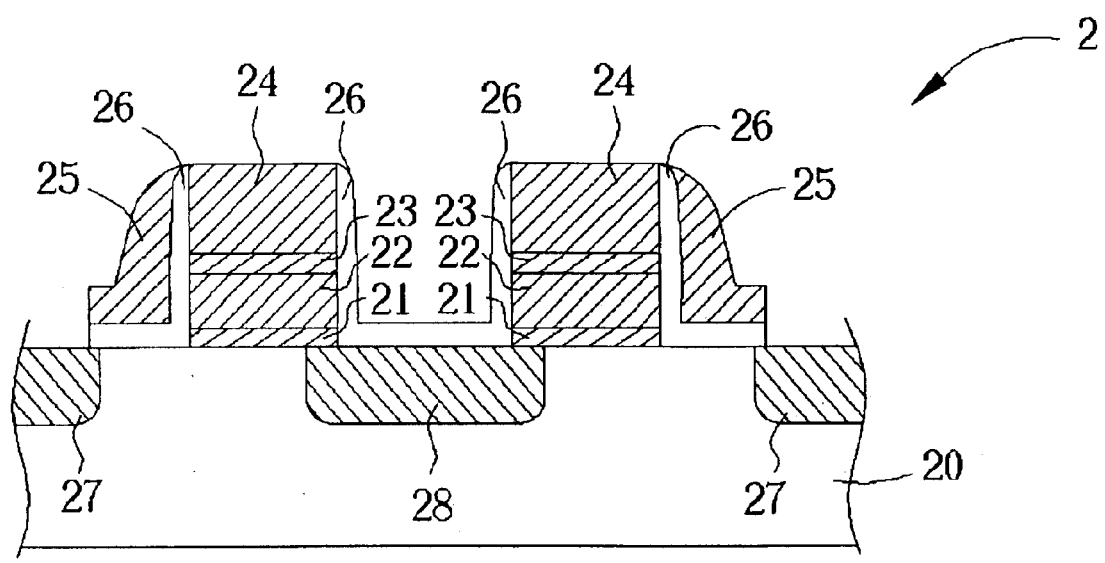
FIG. 2 illustrates another prior art non-volatile memory cell structure 2 having a split gate.

The preferred embodiment in accordance with the present invention will be discussed in detail with reference to FIG. 3, in which like reference numerals designate similar or corresponding elements, regions, and portions. It is understood that the type of semiconductor regions and device layout are chosen solely for illustration, and persons having ordinary skill in the art would recognize other alternatives, variations, and modifications.

Figure 3:
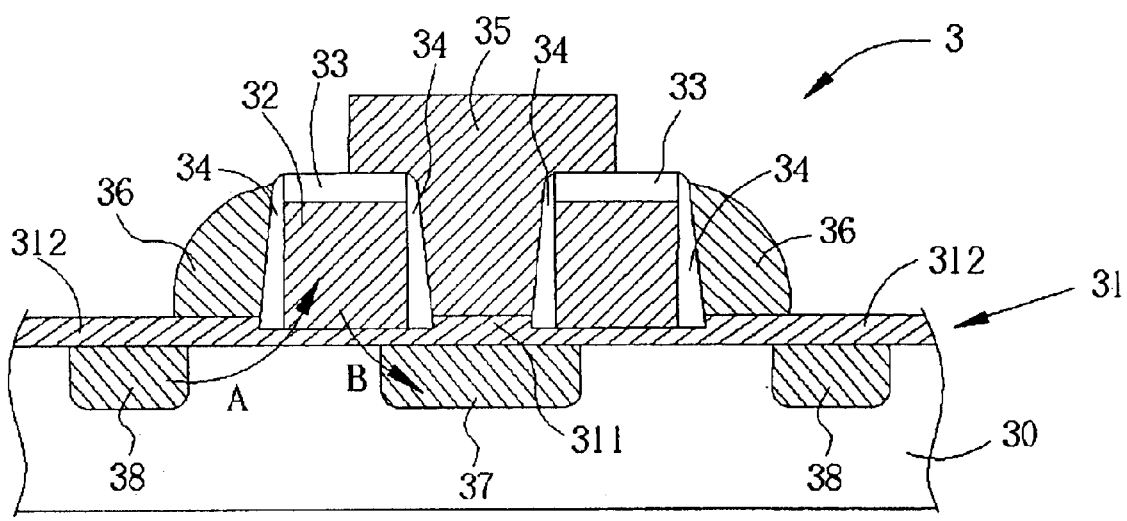
FIG. 3 is a cross-sectional, schematic diagram illustrating a non-volatile memory cell structure 3 according to the preferred embodiment of the present invention.

Please refer to FIG. 3. FIG. 3 is a cross-sectional, schematic diagram illustrating a non-volatile memory cell structure 3 according to the preferred embodiment of the present invention. The non-volatile memory cell structure 3 includes a substrate 30, a tunneling oxide layer 31, floating gates 32, a dielectric layer 33, a plurality of spacers 34, a control gate 35, and split gates 36.

In this embodiment, the substrate 30 is a P type silicon substrate. Three spaced-apart doped regions are provided in the substrate 30. Dopants such as elements of the group VA of the periodic table are implanted into the substrate 30 to form the doped regions, which acts as a drain 37 and sources 38 of the nonvolatile memory cell structure 3. As indicated, the drain 37 is disposed between the sources 38.

The tunneling oxide layer 31 is formed on the substrate 30. In this embodiment, the tunneling oxide layer 31, which has a thickness of about 90 angstroms, is formed by conventional thermal oxidation methods or rapid thermal oxidation methods. It is worthy noted that the thickness of the oxide layer on the substrate 30 is not the same across the cell area. As specifically indicated in FIG. 3, control gate oxide layer 311 between the two floating gates 32 is thicker than the neighboring tunneling oxide layer 31 and split gate oxide layer 312 formed at one outer side of each of the floating gates 32 is also thicker.

Each of the floating gates 32 is disposed on the tunneling oxide layer 31 and Is between the drain 37 and the source 38. In accordance with the preferred embodiment of this invention, the floating gates 32 are made of polysilicon and has a thickness of about 1500 angstroms. When performing a writing operation, electrons flow into the channel from the source 38, and are then injected and trapped in the floating gates 32 (path A).

The dielectric layer 33 is formed on the floating gate 32. Preferably, the dielectric layer 33 includes an Oxide/Nitride/Oxide (ONO) film. The formation of the ONO film is known in the art. For example, a 40-angstrom thick first silicon dioxide layer is deposited. A 60-angstrom thick silicon nitride layer Is then formed on the first silicon dioxide layer, followed by the deposition of a 60-angstrom thick second silicon dioxide layer.

The spacers 34 are formed on sidewalls of the floating gates 32. In accordance with the preferred embodiment of this invention, the formation of the spacers 34 includes the steps of forming a silicon dioxide layer on sidewalls of the floating gates 32, depositing a silicon nitride layer over the silicon dioxide layer, and etching back the film stack consisting of the silicon dioxide layer and the silicon nitride layer.

As shown in FIG. 3, the control gate 35 is disposed over the drain 37 and is between the two floating gates 32. In accordance with the preferred embodiment of this invention, the control gate 35 extends to the area over the dielectric layer 33. The control gate 35 is isolated from the neighboring floating gates 32 by the dielectric layer 33 and the spacer 34. It is noted that the overlapping area between the control gate 35 and each of the floating gates 32 is greater than the upper surface area of each of the floating gates 32.

The split gates 36 are formed on the tunneling oxide layer 31. As mentioned, the split gates 31 are formed on one outer side of each of the floating gates 32, such that each of the split gates 36 is disposed opposite to the control gate 35. In accordance with the preferred embodiment of this invention, the control gate 35 and the split gates 36 are fabricated in the same semiconductor process. More specifically, the control gate 35 and the split gates 36 are made from the same polysilicon layer. The split gates 36 are defined by using a self-aligned etching such that the split gate lengths are substantially equal (symmetric configuration). As shown in FIG. 3, when performing a programming operation, electrons are injected into the floating gates from the sources 38 by way of path A. When performing an erasing operation, electrons are pulled out from the floating gates 32 to the drain 37 by way of path B.

The present invention also pertains to a manufacturing method for making the non-volatile memory cell structure 3. The manufacturing method includes the steps of providing a substrate having thereon a tunneling oxide layer, a floating gate layer and a dielectric layer; etching the floating gate layer and the dielectric layer in order to define two floating gates; forming a plurality of spacers on sidewalls of the floating gates; oxidizing the substrate to grow a control gate oxide layer between the two floating gates and split gate oxide layer on an outer side of each of the two floating gates; implanting ions into the substrate to form a drain between the two floating gates; depositing a gate layer over the substrate, the gate layer covering the dielectric layer and the spacers;forming a photo mask on the gate layer, the photo mask being disposed over the drain; and etching the gate layer to form a control gate over the drain and simultaneously form a split gate at the outer side of each of the two floating gate in a self-aligned manner, the split gate being opposite to the control gate.

In the following, the method for manufacturing the non-volatile memory cell structure in accordance with the preferred embodiment of the present invention will be discussed in detail with reference to FIG. 4 through FIG. 9.

Figure 4:
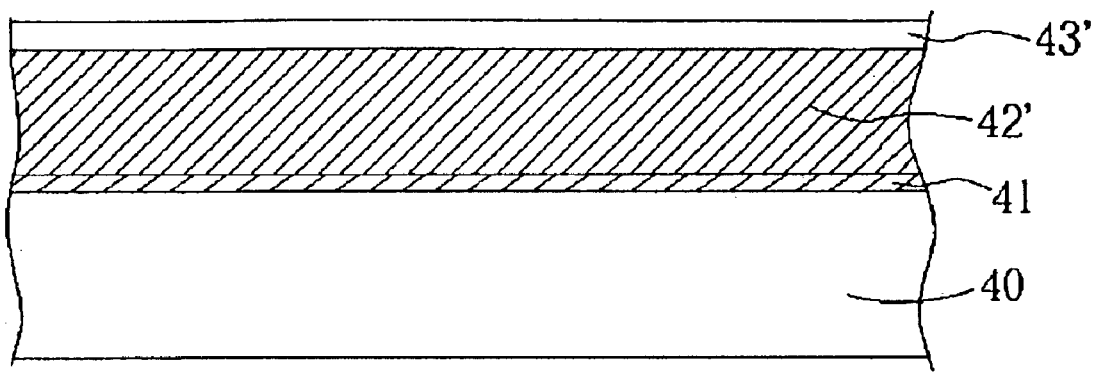
FIG. 4 to FIG. 9 are cross-sectional, schematic diagrams illustrating the method for manufacturing the non-volatile memory cell structure in accordance with the preferred embodiment of the present invention.

Referring to FIG. 4, a tunneling oxide layer 41, a floating gate layer 42", and a dielectric layer 43 are sequentially formed on a substrate 40. In accordance with the preferred embodiment of this invention, the floating gate layer 42" is the first polysilicon layer of the non-volatile memory cell structure. The dielectric layer 43 includes a first silicon dioxide layer, a silicon nitride layer, and a second silicon dioxide layer.

Figure 5:
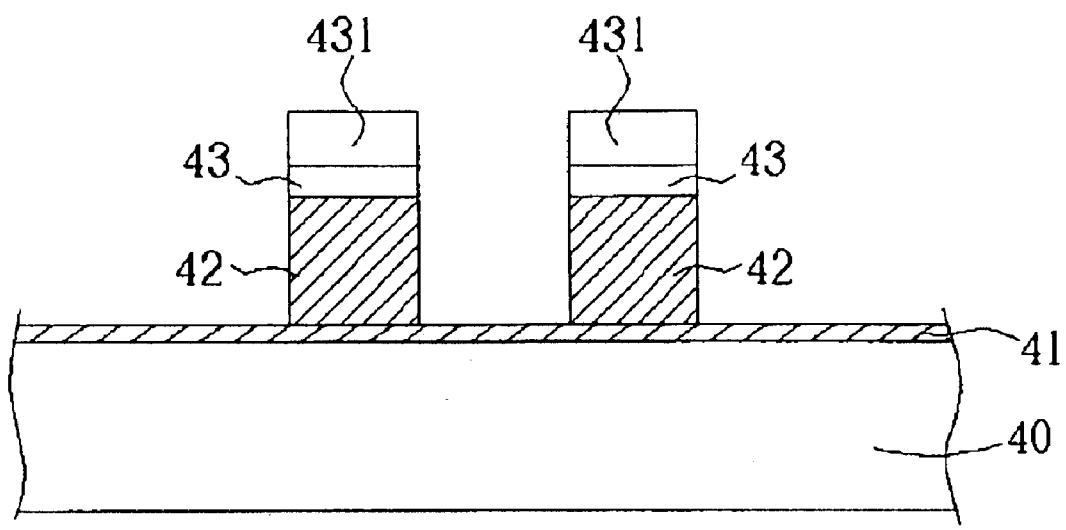

Referring to FIG. 5, a patterned photo mask 431 is formed on the dielectric layer 43". The formation of the photo mask 431 is known in the art. For example, a conventional lithographic process can be used to form the photo mask 431. Using the photo mask 431 as an etching hard mask, the etching process is carried out to etch the dielectric layer 43" and the floating gate layer 42", thereby defining the floating gates 42 and capacitor dielectric layer 43 thereon of the non-volatile memory cell structure. The photo mask 431 is then stripped after the formation of the floating gates 42 and the dielectric layer 43.

Figure 6:
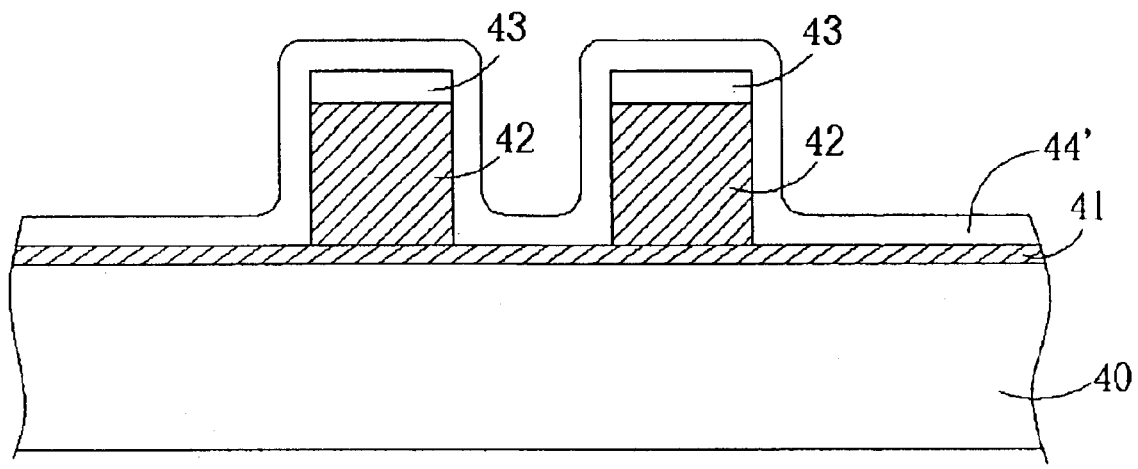

Referring to FIG. 6, a spacer material layer 44" is deposited on the substrate 40.

An anisotropic dry etching process is then carried out to etch the spacer material layer 44" so as to form self-aligned spacers 44 on sidewalls of the floating gates 42, as shown In FIG. 4D. In accordance with the preferred embodiment of this invention, the spacer material layer 44" includes a silicon dioxide layer and a silicon nitride layer.

Figure 7:
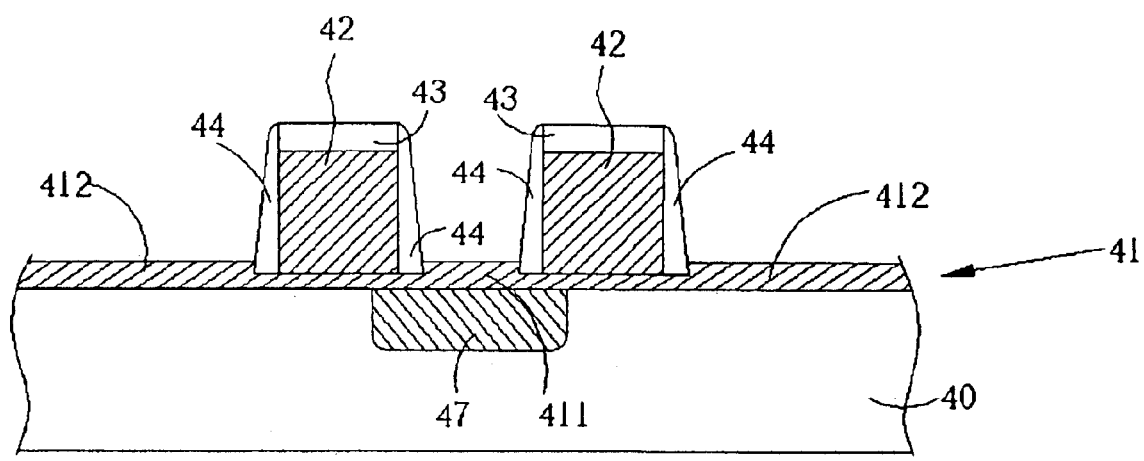

Still referring to FIG. 7, after the formation of the spacers 44, an oxidation process such as a thermal oxidation process or a rapid thermal process is performed to grow a control gate oxide layer 411 between the floating gates 42 and, at the same time, to grow a split gate oxide layer on an outer side of each of the floating gates 42. At this phase, the dielectric layer 43 and the spacers 44 form an ONO (Oxide/Nitride/Oxide) structure. Thereafter, an ion implantation process is performed to form a drain 47 between the two floating gates 42 in the substrate 40. In accordance with the preferred embodiment of this invention, dopants implanted in the drain 47 may be elements of group VA such as phosphorus or arsenic.

Figure 8:
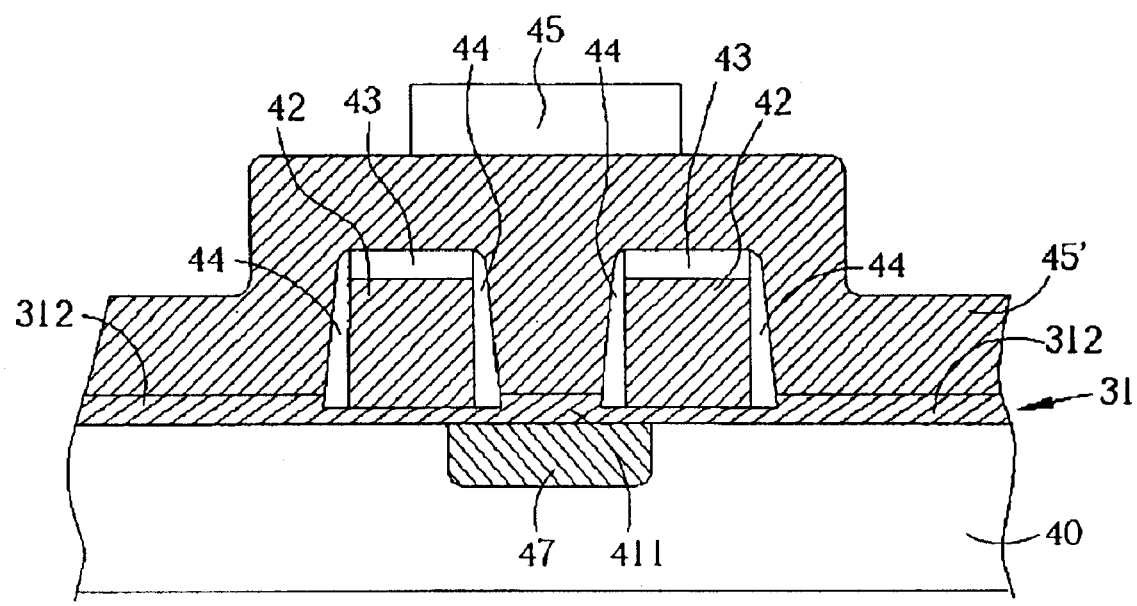

Referring to FIG. 8, a gate layer 45" is deposited over the substrate 40. A patterned photo mask 451 is formed on the gate layer 45". In accordance with the preferred embodiment of this invention, the gate layer 45" is the second polysilicon layer of the non-volatile memory cell structure The photo mask 451 is disposed over the drain 47. It is noted that the covered area by the photo mask 451 determines the size of the control gate, which is formed in the following process. In other words, the pattern of the photo mask 451 determines the overlapping area between the control gate and the underlying floating gates 42. In accordance with the preferred embodiment of this invention, the photo mask 451 overlaps with the top surface of the two floating gates 42.

Figure 9:
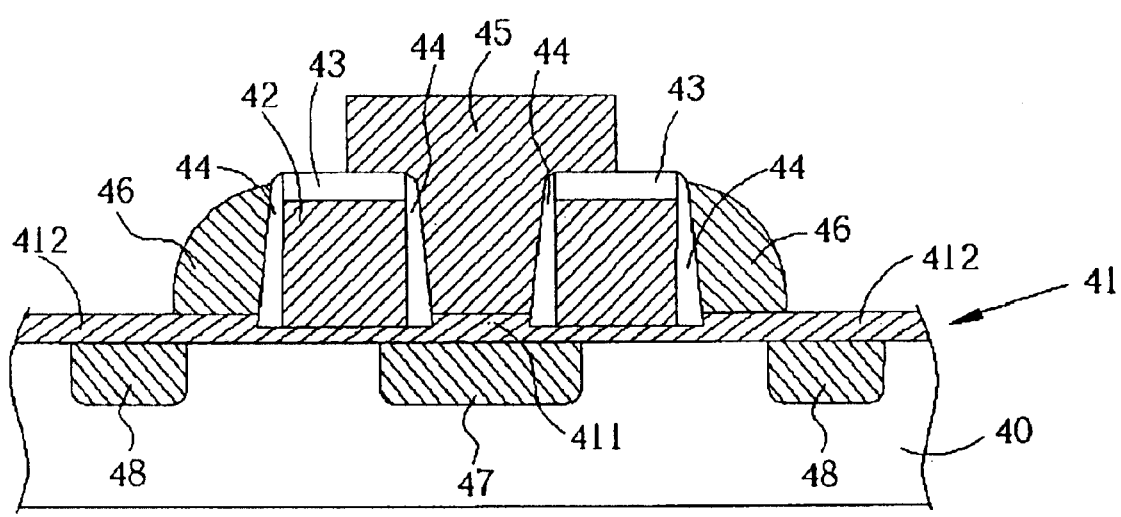

Referring to FIG. 9, using the photo mask 451 as an etching mask, an etching process is carried out to etch the gate layer 45", thereby defining the control gate 45 and a split gate 46 at the outer side of each of the two floating gates 42. It is worthy noted that the split gates 46 are formed in a self-aligned manner. In this case, the control gate 45 extends to the top of the dielectric layer 43. Since the control gate 45 is isolated from the floating gates 42 by the dielectric layer 43 and the spacers 44, the overlapping area between the control gate 45 and each of the floating gates 42 can be greater than the top surface area of each of the floating gates 42.

Still referring to FIG. 9, the photo mask 451 is then stripped. After this, anion implantation is carried out to form sources 48 in the substrate 40 in the area adjacent to the split gates 46.

To sum up, one major characteristic of this invention is that the control gate is disposed between the two floating gates such that the overlapping area between the control gate and the floating gates includes the sidewalls of the floating gates and a portion of the top surface of the floating gates, thereby increasing the coupling ratio. An increased coupling ratio of the non-volatile memory cell avoids potential high voltage problems when the cell size is further miniaturized. Another major characteristic of this invention Is that the non-volatile memory cell structure only involves two layers of polysilicon compared to the prior art three-layer polysilicon method. The control gate and the split gates are simultaneously formed by etching the same gate layer (second polysilicon layer) in a self-aligned manner, thereby producing a symmetric split gate structure having substantially equal split gate length. Moreover, the deposition and etching of the second polysilicon layer can be well compatible with the peripheral circuit processes.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A non-volatile memory cell structure, comprising:
   a substrate having thereon at least a drain and two sources, wherein the drain is disposed between the two sources;
   a tunneling oxide layer formed on the substrate;
   two floating gates disposed on the tunneling oxide layer, wherein each of the two floating gates is disposed between the drain and one of the two sources;
   a dielectric layer disposed on the floating gates;
   a plurality of spacers formed on sidewalls of the floating gates;
   a control gate formed over the drain, wherein the control gate is disposed between the two floating gates; and
   two split gates formed on an outer side of the floating gates opposite to the control gate, wherein the control gate and the split gates are simultaneously formed in a semiconductor process.

2. The non-volatile memory cell structure of claim 1 wherein the control gate extends to a top area of the dielectric layer.

3. The non-volatile memory cell structure of claim 2 wherein the control gate is isolated from the floating gates by the dielectric layer and the spacers, wherein the overlapping area between the control gate and each of the floating gates is greater than a top surface area of each of the floating gates.

4. The non-volatile memory cell structure of claim 1 wherein the dielectric layer comprises a silicon oxide layer and a silicon nitride layer.

5. The non-volatile memory cell structure of claim 1 wherein the spacer comprises a silicon oxide layer and a silicon nitride layer.

* * * * *